United States Patent
Edelstein et al.

(10) Patent No.: US 11,222,817 B2
(45) Date of Patent: *Jan. 11, 2022

(54) ADVANCED COPPER INTERCONNECTS WITH HYBRID MICROSTRUCTURE

(71) Applicant: Tessera, Inc., San Jose, CA (US)

(72) Inventors: Daniel C. Edelstein, White Plains, NY (US); Chih-Chao Yang, Glenmont, NY (US)

(73) Assignee: Tessera, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/835,056

(22) Filed: Mar. 30, 2020

(65) Prior Publication Data

US 2020/0227317 A1   Jul. 16, 2020

Related U.S. Application Data

(60) Continuation of application No. 16/057,056, filed on Aug. 7, 2018, now Pat. No. 10,615,074, which is a division of application No. 15/470,038, filed on Mar. 27, 2017, now Pat. No. 10,276,435, which is a division of application No. 14/952,017, filed on Nov. 25, 2015, now Pat. No. 9,799,605.

(51) Int. Cl.
| | |
|---|---|
| *H01L 23/52* | (2006.01) |
| *H01L 21/768* | (2006.01) |
| *H01L 23/532* | (2006.01) |
| *H01L 21/02* | (2006.01) |
| *H01L 23/528* | (2006.01) |
| *H01L 21/288* | (2006.01) |

(52) U.S. Cl.
CPC .. *H01L 21/76883* (2013.01); *H01L 21/02164* (2013.01); *H01L 21/7684* (2013.01); *H01L 21/76816* (2013.01); *H01L 21/76843* (2013.01); *H01L 21/76846* (2013.01); *H01L 21/76864* (2013.01); *H01L 21/76877* (2013.01); *H01L 23/5283* (2013.01); *H01L 23/53228* (2013.01); *H01L 23/53238* (2013.01); *H01L 21/288* (2013.01); *H01L 2221/1094* (2013.01)

(58) Field of Classification Search
None
See application file for complete search history.

(56) References Cited

U.S. PATENT DOCUMENTS

| | | |
|---|---|---|
| 3,600,294 A | 8/1971 | Rubin et al. |
| 4,086,264 A | 4/1978 | Brooks et al. |
| (Continued) | | |

OTHER PUBLICATIONS

Dubreuil et al., "Characterization of Copper Grain Growth Limitations Inside Narrow Wires Depending of Overburden Thickness," Microelectronics Engineering, vol. 85, 2008, pp. 1988-1991.

(Continued)

*Primary Examiner* — Moin M Rahman
(74) *Attorney, Agent, or Firm* — Lee & Hayes, P.C.

(57) ABSTRACT

A device relates to a semiconductor device. The semiconductor device includes a narrow-line bamboo microstructure integrated within a metal layer of the semiconductor device and a narrow-line polycrystalline microstructure. The narrow-line polycrystalline microstructure is integrated within the same metal layer as the narrow-line bamboo microstructure.

18 Claims, 3 Drawing Sheets

(56) References Cited

U.S. PATENT DOCUMENTS

| | | | |
|---|---|---|---|
| 5,838,707 | A | 11/1998 | Ramdani et al. |
| 6,818,528 | B2 | 11/2004 | Mandelman et al. |
| 6,864,152 | B1 | 3/2005 | Mirbedini et al. |
| 6,932,916 | B2 | 8/2005 | Manger et al. |
| 6,969,686 | B2 | 11/2005 | Hsieh et al. |
| 7,284,958 | B2 | 10/2007 | Dundas et al. |
| 7,318,577 | B2 | 1/2008 | Kouzu |
| 7,545,040 | B2 | 6/2009 | Ueki et al. |
| 7,566,653 | B2 | 7/2009 | Yang et al. |
| 7,666,787 | B2 | 2/2010 | Yang et al. |
| 7,700,487 | B2 | 4/2010 | Furusawa et al. |
| 7,732,922 | B2 | 6/2010 | Yang et al. |
| 8,575,035 | B2 | 11/2013 | Chen et al. |
| 8,853,091 | B2 | 10/2014 | Sato et al. |
| 9,184,134 | B2 | 11/2015 | Lin et al. |
| 9,631,291 | B2 | 4/2017 | Scott et al. |
| 9,799,605 | B2 | 10/2017 | Edelstein et al. |
| 10,276,435 | B2 | 4/2019 | Edelstein et al. |
| 10,615,074 | B2 * | 4/2020 | Edelstein .......... H01L 21/76877 |
| 2002/0115292 | A1 * | 8/2002 | Andricacos ....... H01L 21/76886 438/687 |
| 2004/0188835 | A1 | 9/2004 | Owada |
| 2004/0259348 | A1 | 12/2004 | Basol et al. |
| 2006/0113685 | A1 * | 6/2006 | Ueki ................. H01L 23/53233 257/785 |
| 2009/0174075 | A1 * | 7/2009 | Yang ................. H01L 23/53233 257/751 |
| 2010/0327447 | A1 * | 12/2010 | Iguchi ............... H01L 23/53233 257/751 |
| 2011/0175226 | A1 * | 7/2011 | Bonilla ............. H01L 21/76847 257/751 |
| 2012/0146220 | A1 | 6/2012 | Sasajima et al. |
| 2014/0342177 | A1 | 11/2014 | Wiley |

OTHER PUBLICATIONS

Lienig, "Electromigration and Its Impact On Physical Design in Future Technologies," ACM International Symposium on Physical Design (ISPD), 2013, pp. 33-40.

* cited by examiner

ADVANCED COPPER INTERCONNECTS WITH HYBRID MICROSTRUCTURE

DOMESTIC PRIORITY

The present application is a continuation of U.S. patent application Ser. No. 16/057,056, filed on Aug. 7, 2018 (now U.S. Pat. No. 10,615,074), which is a divisional of U.S. patent application Ser. No. 15/470,038, filed on Mar. 27, 2017 (now U.S. Pat. No. 10,276,435), and U.S. patent application Ser. No. 14/952,017, filed on Nov. 25, 2015 (now U.S. Pat. No. 9,799,605), all of which are hereby incorporated by reference in their entirety.

BACKGROUND

The present invention relates to semiconductor devices, and more specifically, to the presence of a narrow-line bamboo microstructure and narrow-line polycrystalline microstructure integrated in the same metal layer.

Generally, semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure typically includes copper, Cu.

SUMMARY

According to one embodiment, a method of forming a semiconductor device is provided. The method includes applying a masking material to a first portion of a dielectric layer; forming a first masked portion of the dielectric layer; forming a first narrow-line trench in a second portion of the dielectric layer, wherein the first narrow-line trench has a depth, $d_1$; forming a second narrow-line trench in the first portion of the dielectric layer, wherein the second narrow-line trench has a depth, $d_2$, wherein the depth $d_1$ is smaller than the depth $d_2$; depositing a liner material into the first narrow-line trench and the second narrow-line trench and onto the dielectric layer; plating copper onto the liner material; and annealing the dielectric layer to form the semiconductor device, wherein a narrow-line bamboo microstructure is formed in the second portion of the dielectric layer and wherein a narrow-line polycrystalline microstructure is formed in the first portion of the dielectric layer.

According to one embodiment, a semiconductor device is provided. The semiconductor device includes a narrow-line bamboo microstructure integrated within a metal layer of the semiconductor device; and a narrow-line polycrystalline microstructure; wherein the narrow-line polycrystalline microstructure is integrated within the same metal layer as the narrow-line bamboo microstructure.

According to one embodiment, an integrated circuit is provided. The integrated circuit includes a narrow-line bamboo microstructure integrated within a metal layer of the semiconductor device, wherein the narrow-line bamboo microstructure comprises nanowires configured to provide a high reliability resistance circuit and wherein the narrow-line bamboo microstructure has a depth, $d_1$; and a narrow-line polycrystalline microstructure wherein the narrow-line polycrystalline microstructure has a higher depth in the metal layer as compared to the narrow-line bamboo microstructure and wherein the narrow-line polycrystalline microstructure has a depth, $d_2$, wherein $d_1$ is less than $d_2$; wherein the narrow-line polycrystalline microstructure is integrated within the same metal layer as the narrow-line bamboo microstructure.

DETAILED DESCRIPTION

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in integrated circuit product chips by embedding the metal lines and metal vias (e.g., conductive features) in a dielectric material having a dielectric constant of less than silicon dioxide.

Conductive material within the conductive region has a low electromigration resistance due to a high number of electromigration paths inside the conductive region. The electromigration problem is expected to increase in future semiconductor technologies due to the scaling of such devices.

Thus, there is a continued desire to provide interconnect structures where the electromigration has been substantially reduced and/or eliminated. Copper diffusion in semiconductor devices can occur through copper grain boundaries, increasingly so when narrow-line polycrystalline microstructures are present. To provide increased electromigration resistance (e.g., greater than 0.9 electron Volt (eV) of electromigration activation energy), it can be desirable to provide copper wires (i.e., interconnects) with narrow-line bamboo microstructures. Since narrow-line bamboo microstructures dispersed within shallow features provide lower conductivity than narrow-line polycrystalline microstructures, it can be desirable to include both narrow-line polycrystalline microstructures and narrow-line bamboo microstructures within the same metal layer of a semiconductor device. Such a semiconductor device can provide the desired qualities of high conductivity (e.g., less than 4 microOhm-centimeters ($\mu$-cm) copper (Cu) resistivity in lines having a thickness of less than 100 nm) and high electromigration resistance.

Figure 1:
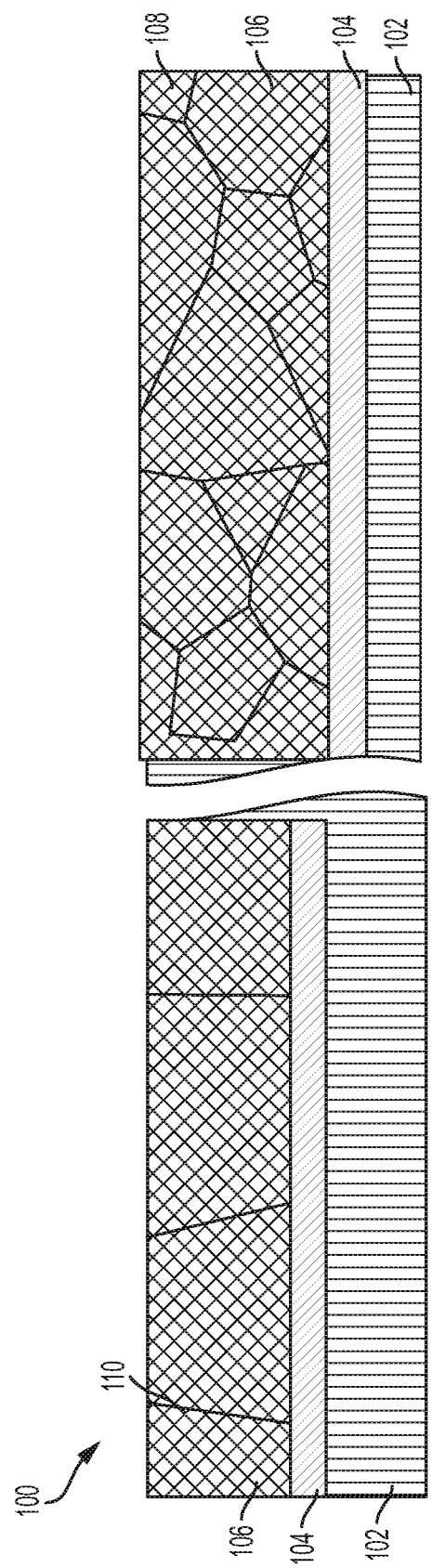
FIG. 1 is a cross-sectional illustration of metal layer of a semiconductor device having a narrow-line polycrystalline microstructure and a narrow-line bamboo microstructure according to an embodiment. Narrow-line as described herein generally refers to a minimum width on a feature side of the microstructure. The minimum width can be less than or equal to 175 nanometers (nm), for example, less than or equal to 100 nm, for example, less than or equal to 75 nm.

FIG. 1 is a longitudinal illustration of a metal layer 100 of a semiconductor device. The metal layer 100 includes a low-κ dielectric material 102 with a liner material 104 disposed adjacent to the low-κ dielectric material 104 with copper 106 disposed adjacent to the liner material 104 such that the liner material 104 is located between the low-κ dielectric material 102 and the copper 106. Narrow-line bamboo microstructure 110 and narrow-line polycrystalline microstructure 108 are both present in metal layer 100. In the narrow-line bamboo microstructure 110, the grain boundaries can end at either a top of the surface of the copper 106 or at an interface between the copper 106 and liner material 104. With the narrow-line bamboo microstructure 110, there are not triple junctions as can be observed in the narrow-line polycrystalline microstructure. The narrow-line bamboo microstructure 110 and the narrow-line polycrystalline microstructure can each include nanowires. In the narrow-line bamboo microstructure 110, grain boundaries can be perpendicular to a width of the wire and to current flow. As a result, boundary diffusion can be reduced or eliminated also thereby reducing or eliminating material transport. As illustrated in FIG. 1, narrow-line bamboo microstructure 110 can be substantially perpendicular to liner material 104. It is to be understood, however, the narrow-line bamboo microstructure does not have to be perpendicular to the liner material 104.

An interconnect structure can be made by utilizing interconnect processing, e.g., by applying the dielectric material 102 to a surface of a substrate (not shown). The substrate, which is not shown, can comprise a semiconducting material, an insulating material, a conductive material or a combination comprising at least one of the foregoing. When the substrate is comprised of a semiconducting material, any semiconductor such as Si, SiGe, SiGeC, SiC, Ge alloys, GaAs, InAs, InP and other 111/V or II/VI compound semiconductors may be used. In addition to these listed types of semiconducting materials, the semiconductor substrate can be a layered semiconductor such as, for example, Si/SiGe, Si/SiC, silicon-on-insulators (SOis) or silicon germanium-on-insulators (SGOis).

When the substrate is an insulating material, the insulating material can be an organic insulator, an inorganic insulator or a combination comprising at least one of the foregoing including multilayers. When the substrate is a conducting material, the substrate can include, for example, polySi, an elemental metal, alloys of elemental metals, a metal silicide, a metal nitride or a combination comprising at least one of the foregoing including multilayers. When the substrate comprises a semiconducting material, one or more semiconductor devices such as, for example, complementary metal oxide semiconductor (CMOS) devices can be fabricated thereon.

The low-κ dielectric material 102 can include any inter-level or intralevel dielectric including inorganic dielectrics or organic dielectrics. The low-κ dielectric material 102 can be porous or non-porous. Some examples of dielectrics that can be used as the low-κ dielectric material 102 include, but are not limited to: SiO2, silsesquixoanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The low-κ dielectric material 102 can have a dielectric constant that is about 3.0 or less, with a dielectric constant of about 2.8 or less being even more typical. These dielectrics generally have a lower parasitic cross talk as compared with dielectric materials that have a higher dielectric constant than 3.0. The thickness of the low-κ dielectric material 102 can vary depending upon the dielectric material used as well as the exact number of dielectrics metal layer 12. For example, the low-κ dielectric material 102 can have a thickness from about 200 to about 450 nm.

The portion of the metal layer 100 with the narrow-line bamboo microstructure 110 can provide high reliability, e.g., high electromigration resistance, while the portion of the metal layer 100 with the narrow-line polycrystalline microstructure 108 can provide high performance, e.g., high conductivity. For example, the narrow-line bamboo microstructure 110 can be configured to provide a high reliability resistance circuit such as high electromagnetic resistance as compared to the polycrystalline structure 108. The narrow-line polycrystalline microstructure 108 can be configured to provide a high performance circuit, such as higher conductivity as compared to the narrow-line bamboo microstructure 110.

As illustrated in FIG. 1, the narrow-line polycrystalline microstructure 108 can have a higher (i.e., longer) depth in the metal layer 100 as compared to the narrow-line bamboo microstructure 110. For example, compared to the narrow-line bamboo microstructure 110, the polycrystalline area has a larger copper cross-sectional area and can provide a higher conductivity due to the larger cross-sectional area.

Figure 2:
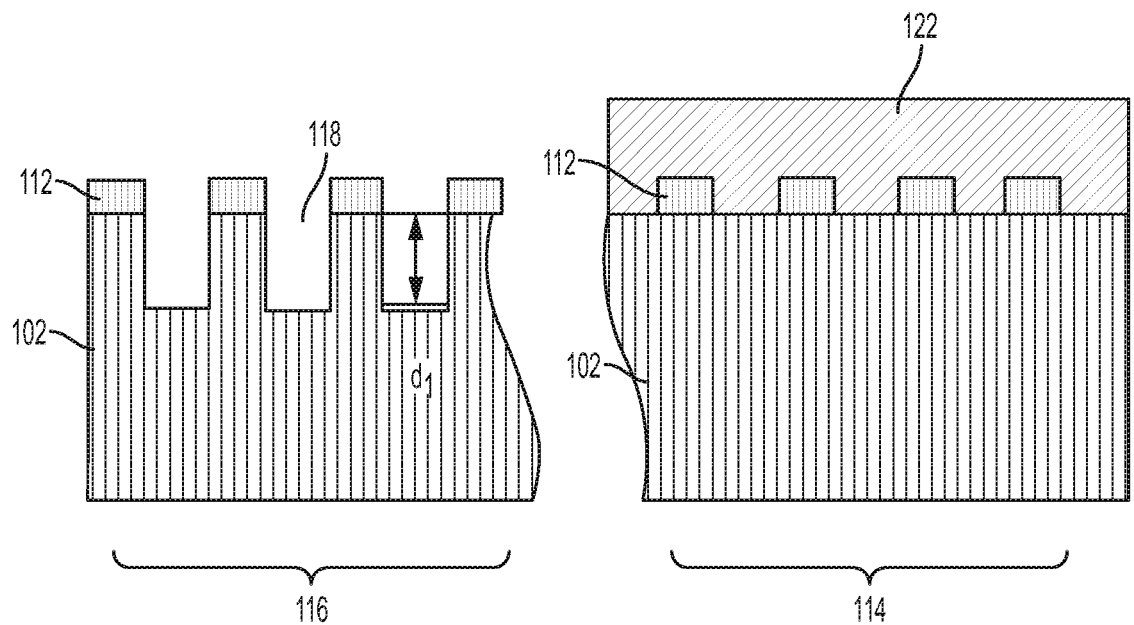
FIG. 2 is a cross-sectional view a semiconductor device illustrating blocking of one portion of a metal layer to form a narrow-line bamboo microstructure on the other portion of the metal layer according to an embodiment.
Figure 3:
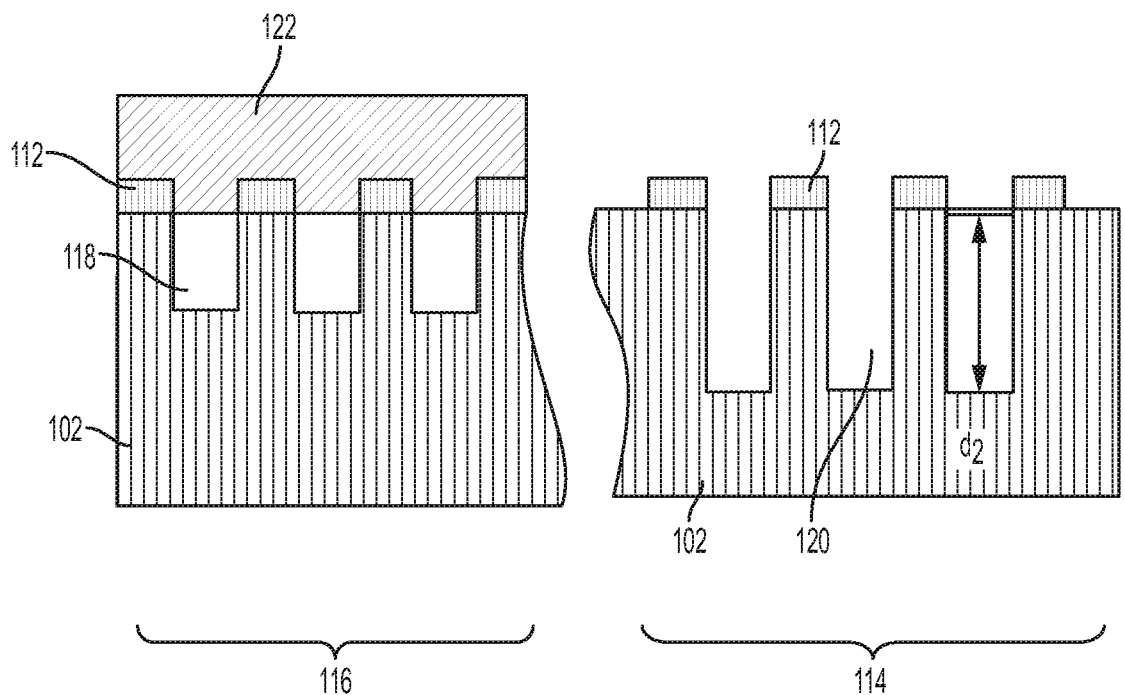
FIG. 3 is a cross-sectional view of a semiconductor device illustrating blocking of the portion of the metal layer on which the bamboo structure is located in order to form a polycrystalline structure on another portion of the metal layer according to an embodiment.

FIGS. 2 and 3 illustrate the blocking portion of the process in forming a metal layer 100 with a narrow-line bamboo microstructure 110 and a narrow-line polycrystalline microstructure 108. As can be seen in FIGS. 2 and 3, a method of forming a semiconductor device can include applying a masking material 112 to a first portion 114 of a dielectric layer 102 forming a first masked portion. A trench 118 can be formed in a second portion 116 of the dielectric layer 102. The trench 118 can have a depth, $d_1$. Masking material 122 can be applied to the first portion 114 of the dielectric layer 102 during formation of trenches 118 and to the second portion 116 of the dielectric layer 102 during formation of trenches 120. The masking material 112 can include insulators, e.g., silicon nitride (SiN) or metallic materials, e.g., tantalum nitride (TaN), titanium nitride (TiN), or a combination comprising at least one of the foregoing. The masking material 112 can include organic an organic photoresist material, A masking material 112 can be applied to the second portion 116 of the dielectric layer 102. A trench 120 can be formed in the first portion 114 of the dielectric layer 102. The trench 120 can have a depth, $d_z$. Depth, $d_1$ can have a smaller value than the depth, $d_z$. The trenches 118, 120 can have be narrow-line trenches, i.e., the trenches 118, 120 can have a minimum width on a feature side of less than or equal to 175 nm, for example, less than or equal to 100 nm, for example, less than or equal to 75 nm.

Figure 4:
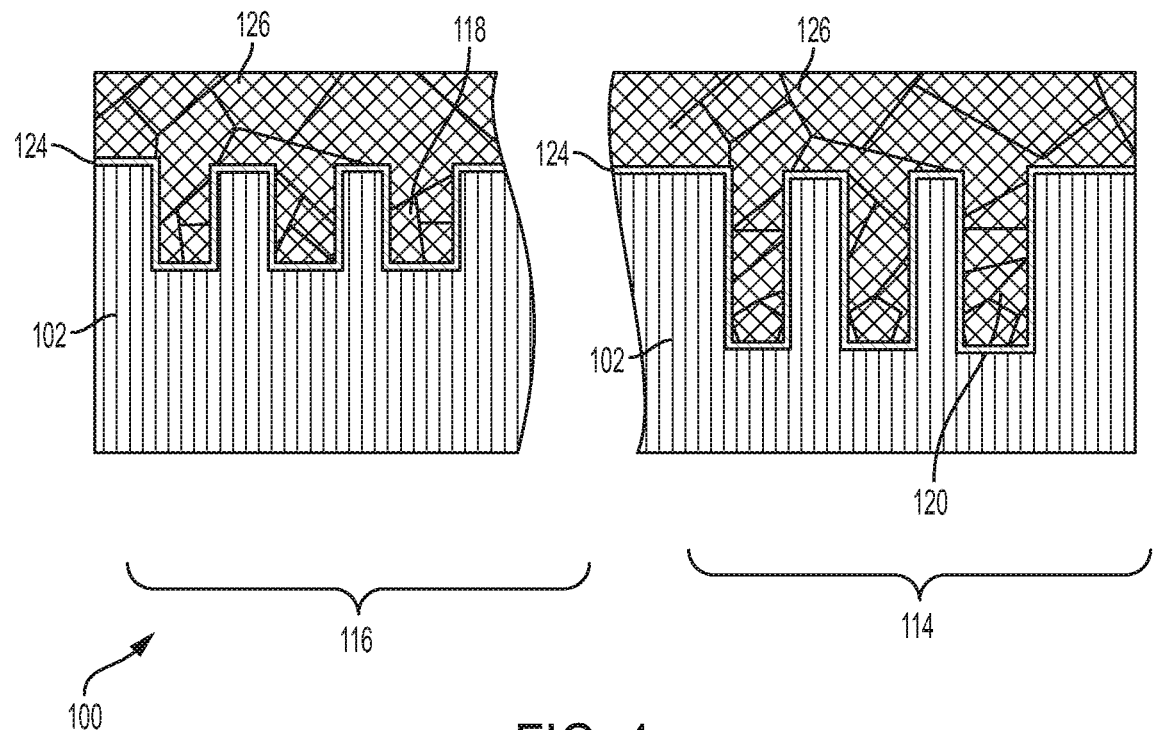
FIG. 4 is a cross-sectional view of the semiconductor device after deposition of liner material and copper filling according to an embodiment.
Figure 5:
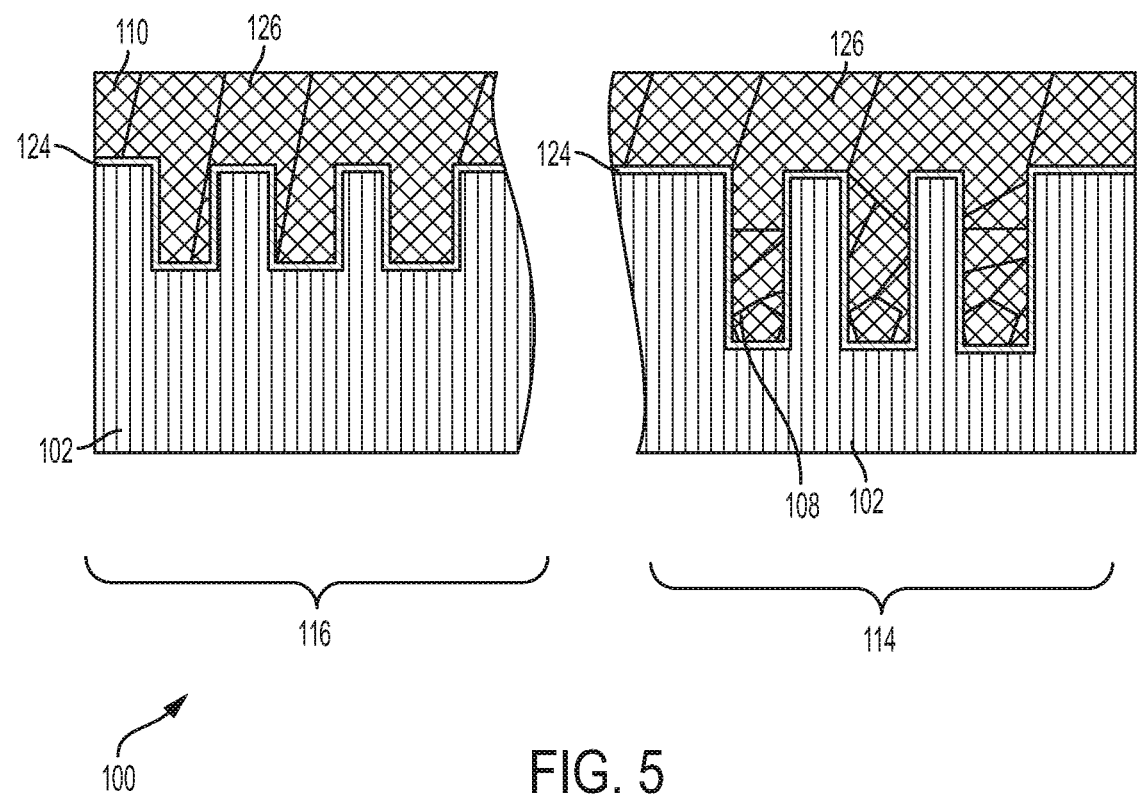
FIG. 5 is a cross-sectional view of the semiconductor device after thermal annealing according to an embodiment.

Turning now to FIGS. 4 and 5, a liner material 124 can be deposited into the first trench 118 and the second trench 120 and onto the dielectric layer 102. The liner material can include tantalum, titanium, tungsten, cobalt, ruthenium, nitrides thereof, or a combination comprising at least one of the foregoing. Copper (Cu) 126 can be plated onto the liner material 124. Following the copper plating process illustrated in FIG. 4, there is no obvious microstructure differences between first portion 114 and second portion 116. Both first portion 114 and second portion 116 contain narrow-line polycrystalline microstructures. Copper 126 can be annealed at a temperature of 100 to 400° C. for 0.5 to 4 hours to form the semiconductor device. During the annealing process, Cu recrystallization and grain growth start to modulate the interconnect microstructure in order to reduce the overall energy. Cu grain growth is normally observed from the top Cu overburden area and grows into the patterned and smaller dimensional features. The driving force is normally sufficient to prompt the grain growth into a top portion of the patterned features, but not enough to completely penetrate into a bottom of a deep feature. A narrow-line bamboo microstructure 110 is formed in the second portion 116 of the copper 126 after annealing as illustrated in FIG. 5 and a narrow-line polycrystalline microstructure 108 is formed in the first portion 114 of copper 126 after annealing.

Although illustrated with respect to one metal layer in a semiconductor device, the narrow-line bamboo microstructure 110 and the narrow-line polycrystalline microstructure 108 can be located in more than one layer in the semiconductor device (e.g., greater than or equal to 1 layer). An aspect ratio between (e.g., height to width) the narrow-line bamboo microstructure 110 and the narrow-line polycrystalline microstructure 108 can be greater than 0.5. The metal layer 100 can be subjected to a polishing process such as chemical mechanical planarization (CMP) after formation of the narrow-line bamboo microstructure 110 and the narrow-line polycrystalline microstructure 108.

An integrated circuit can be formed using the semiconductor device disclosed herein.

Deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography, nanoimprint lithography, and reactive ion etching.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

In the foregoing description, numerous specific details are set forth, such as particular structures, components, materials, dimensions, processing steps and techniques, in order to provide a thorough understanding of the present invention. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit comprising:
a first wire, extending in a first direction parallel to a substrate, comprising a narrow-line bamboo microstructure integrated within a first metal layer of the integrated circuit, wherein the narrow-line bamboo microstructure has a depth, $d_1$; and a second wire, extending in the first direction parallel to the substrate, comprising a narrow-line polycrystalline microstructure, wherein the narrow line polycrystalline microstructure has a depth, $d_2$, wherein $d_1$ is less than $d_2$, wherein the first and second wires are integrated within the same metal layer, a third wire extending in a second direction parallel to the substrate, the third wire comprising a narrow-line bamboo microstructure integrated within a second metal layer of the integrated circuit, wherein the narrow-line bamboo microstructure has a depth, $d_3$; and a fourth wire, extending in the second direction parallel to the substrate, the fourth wire comprising a narrow-line polycrystalline microstructure, wherein the narrow-line polycrystalline microstructure has a depth, $d_4$, wherein $d_3$ is less than $d_4$, wherein the third and fourth wires are integrated within the same second metal layer, different from the first metal layer.

2. The integrated circuit of claim 1, wherein the first and second wires comprise copper interconnects.

3. The integrated circuit of claim 1, wherein a difference in aspect ratio between the narrow-line bamboo microstructure and the narrow-line polycrystalline microstructure is greater than 0.5.

4. The integrated circuit of claim 1, wherein:
the first and second wires are disposed on a liner material; and
the liner material is disposed on trench sidewalls within a dielectric layer.

5. The integrated circuit of claim 4, wherein the liner material comprises tantalum, titanium, tungsten, cobalt, ruthenium, and their nitrides thereof, or a combination comprising at least one of the foregoing.

6. The integrated circuit of claim 5, wherein the dielectric layer comprises a low-K dielectric material.

7. The integrated circuit of claim 6, wherein the dielectric layer comprises silicon dioxide, silsesquixoane, organosilicates, thermosetting polyarylene ethers, or a combination comprising at least one of the foregoing.

8. The integrated circuit of claim 7, wherein the dielectric layer comprises silicon dioxide.

9. The integrated circuit of claim 1, wherein the integrated circuit has reduced electromigration as compared to an integrated circuit without a narrow-line bamboo microstructure and a narrow-line polycrystalline microstructure.

10. The integrated circuit of claim 1, wherein an electromigration resistance of the narrow-line bamboo microstructure is greater than 0.9 electron Volt of electromigration energy.

11. The integrated circuit of claim 1, wherein the integrated circuit has a conductivity of less than 4 micro Ohm-centimeters copper resistivity in the narrow-line bamboo microstructure at a thickness of less than 100 nanometers.

12. The integrated circuit of claim 1, wherein the substrate comprises Si, SiGe, SiGeC, SiC, Ge alloys, GaAs, InAs, InP and other 111/V or II/VI compound semiconductors, or a combination comprising at least one of the foregoing.

13. The integrated circuit of claim 4, wherein the liner material comprises tantalum.

14. The integrated circuit of claim 4, wherein the liner material comprises cobalt.

15. The integrated circuit of claim 4, wherein the liner material comprises ruthenium.

16. The integrated circuit of claim 6, wherein the low-K dielectric material has a dielectric constant of about 3.0 or less.

17. The integrated circuit of claim 6, wherein the low-K dielectric material has a dielectric constant of about 2.8 or less.

18. The integrated circuit of claim 1, wherein the narrow-line bamboo microstructure and the narrow-line polycrystalline microstructure each have a minimum width on a feature side of less than or equal to 75 nm.

* * * * *